(12) United States Patent
Chen et al.

(10) Patent No.: US 8,395,165 B2
(45) Date of Patent: Mar. 12, 2013

(54) LATERALLY CONTACTED BLUE LED WITH SUPERLATTICE CURRENT SPREADING LAYER

(75) Inventors: Zhen Chen, Pleasanton, CA (US); William Fenwick, Livermore, CA (US); Steve Lester, Palo Alto, CA (US)

(73) Assignee: Bridelux, Inc., Livermore, CA (US)

( * ) Notice: Subject to any disclaimer, the term of this patent is extended or adjusted under 35 U.S.C. 154(b) by 62 days.

(21) Appl. No.: 13/178,497

(22) Filed: Jul. 8, 2011

(65) Prior Publication Data
US 2013/0009130 A1  Jan. 10, 2013

(51) Int. Cl.
*H01L 27/15* (2006.01)

(52) U.S. Cl. .................. 257/79; 257/78; 257/E33.008; 257/E33.034; 257/E33.049; 438/22

(58) Field of Classification Search .................. 257/78, 257/79, E33.049, E33.034, E33.008; 438/22, 438/28, 29
See application file for complete search history.

(56) References Cited

U.S. PATENT DOCUMENTS

| | | | |
|---|---|---|---|
| 5,306,662 A | 4/1994 | Nakamura et al. | |
| 5,408,120 A | 4/1995 | Manabe et al. | |
| 5,432,808 A | 7/1995 | Hatano et al. | 372/45.01 |
| 5,468,678 A | 11/1995 | Nakamura et al. | |
| 5,563,422 A | 10/1996 | Nakamura et al. | |
| 5,578,839 A | 11/1996 | Nakamura et al. | |
| 5,734,182 A | 3/1998 | Nakamura et al. | |
| 5,747,832 A | 5/1998 | Nakamura et al. | |
| 5,753,939 A | 5/1998 | Sassa et al. | |
| 5,766,783 A | 6/1998 | Utsumi et al. | 428/698 |
| 5,777,350 A | 7/1998 | Nakamura et al. | |
| 5,959,307 A | 9/1999 | Nakamura et al. | |

(Continued)

FOREIGN PATENT DOCUMENTS

| JP | 4267376 A | 2/1991 |
|---|---|---|
| JP | 2626431 | 5/1994 |

(Continued)

OTHER PUBLICATIONS

Mike Cooke, "High-Brightness Nitride LEDs on Silicon Through Wafer Bonding", Jun. 4, 2011. (URL: "http://www.semiconductor-today.com/news_items/2011/June/KOREAPHOTONICS_040611.html").

(Continued)

*Primary Examiner* — David Vu
(74) *Attorney, Agent, or Firm* — Imperium Patent Works; Darien K. Wallace; T. Lester Wallace (57) ABSTRACT

A laterally contacted blue LED device involves a PAN structure disposed over an insulating substrate. The substrate may be a sapphire substrate that has a template layer of GaN grown on it. The PAN structure includes an n-type GaN layer, a light-emitting active layer involving indium, and a p-type GaN layer. The n-type GaN layer has a thickness of at least 500 nm. A Low Resistance Layer (LRL) is disposed between the substrate and the PAN structure such that the LRL is in contact with the bottom of the n-layer. In one example, the LRL is an AlGaN/GaN superlattice structure whose sheet resistance is lower than the sheet resistance of the n-type GnA layer. The LRL reduces current crowding by conducting current laterally under the n-type GaN layer. The LRL reduces defect density by preventing dislocation threads in the underlying GaN template from extending up into the PAN structure.

19 Claims, 4 Drawing Sheets

CROSS-SECTIONAL SIDE VIEW

U.S. PATENT DOCUMENTS

| | | | |
|---|---|---|---|
| 5,959,401 A | 9/1999 | Asami et al. | |
| 6,005,258 A | 12/1999 | Manabe et al. | |
| 6,015,979 A * | 1/2000 | Sugiura et al. | 257/86 |
| 6,040,588 A | 3/2000 | Koide et al. | |
| RE36,747 E | 6/2000 | Manabe et al. | |
| 6,121,635 A | 9/2000 | Watanabe et al. | 257/91 |
| 6,215,133 B1 | 4/2001 | Nakamura et al. | |
| 6,242,764 B1 | 6/2001 | Ohba et al. | 257/190 |
| 6,265,726 B1 | 7/2001 | Manabe et al. | |
| 6,326,236 B1 | 12/2001 | Koide et al. | |
| 6,420,733 B2 | 7/2002 | Koide et al. | |
| 6,541,293 B2 | 4/2003 | Koide et al. | |
| 6,610,995 B2 | 8/2003 | Nakamura et al. | |
| 6,617,060 B2 | 9/2003 | Weeks, Jr. et al. | 428/698 |
| 6,657,236 B1 | 12/2003 | Thibeault et al. | |
| 6,800,500 B2 | 10/2004 | Coman et al. | |
| 6,838,693 B2 | 1/2005 | Kozaki | |
| 6,849,881 B1 | 2/2005 | Harle et al. | |
| 6,891,197 B2 | 5/2005 | Bhat et al. | |
| 6,906,352 B2 | 6/2005 | Edmond et al. | |
| 6,916,676 B2 | 7/2005 | Sano et al. | |
| 6,951,695 B2 | 10/2005 | Xu et al. | |
| 6,977,395 B2 | 12/2005 | Yamada et al. | |
| 7,026,653 B2 | 4/2006 | Sun | |
| 7,106,090 B2 | 9/2006 | Harle et al. | |
| 7,115,908 B2 | 10/2006 | Watanabe et al. | |
| 7,138,286 B2 | 11/2006 | Manabe et al. | |
| 7,193,246 B1 | 3/2007 | Tanizawa et al. | |
| 7,247,985 B2 | 7/2007 | Kaneko et al. | 313/506 |
| 7,262,436 B2 | 8/2007 | Kondoh et al. | |
| 7,312,474 B2 | 12/2007 | Emerson et al. | |
| 7,335,920 B2 | 2/2008 | Denbaars et al. | |
| 7,345,297 B2 | 3/2008 | Yamazoe et al. | |
| 7,348,602 B2 | 3/2008 | Tanizawa | |
| 7,402,838 B2 | 7/2008 | Tanizawa et al. | |
| 7,442,966 B2 | 10/2008 | Bader et al. | |
| 7,446,345 B2 | 11/2008 | Emerson et al. | |
| 7,491,565 B2 | 2/2009 | Coman et al. | |
| 7,547,908 B2 | 6/2009 | Grillot et al. | |
| 7,547,925 B2 | 6/2009 | Wong et al. | 257/103 |
| 7,611,917 B2 | 11/2009 | Emerson et al. | |
| 7,691,651 B2 | 4/2010 | Park | 438/22 |
| 7,709,851 B2 | 5/2010 | Bader et al. | |
| 7,737,459 B2 | 6/2010 | Edmond et al. | |
| 7,754,514 B2 | 7/2010 | Yajima et al. | |
| 7,791,061 B2 | 9/2010 | Edmond et al. | |
| 7,791,101 B2 | 9/2010 | Bergmann et al. | |
| 7,795,623 B2 | 9/2010 | Emerson et al. | |
| 7,813,400 B2 | 10/2010 | Denbaars et al. | 372/45.011 |
| 7,910,945 B2 | 3/2011 | Donofrio et al. | |
| 7,939,844 B2 | 5/2011 | Hahn et al. | |
| 7,947,994 B2 | 5/2011 | Tanizawa et al. | |
| 7,968,865 B2 | 6/2011 | LaRoche et al. | 257/11 |
| 8,021,904 B2 | 9/2011 | Chitnis | |
| 8,030,665 B2 | 10/2011 | Nagahama et al. | |
| 2003/0178642 A1 | 9/2003 | Tanaka et al. | 257/200 |
| 2007/0210304 A1 | 9/2007 | Komiyama et al. | 257/40 |

FOREIGN PATENT DOCUMENTS

| | | |
|---|---|---|
| JP | 2681733 | 5/1994 |
| JP | 2917742 | 6/1994 |
| JP | 2827794 | 8/1994 |
| JP | 2778405 | 9/1994 |
| JP | 2803741 | 9/1994 |
| JP | 2785254 | 1/1995 |
| JP | 8264894 A | 3/1995 |
| JP | 2735057 | 3/1996 |
| JP | 2956489 | 3/1996 |
| JP | 2666237 | 12/1996 |
| JP | 2890396 | 12/1996 |
| JP | 3250438 | 12/1996 |
| JP | 3135041 | 6/1997 |
| JP | 11040847 A | 7/1997 |
| JP | 3209096 | 12/1997 |
| JP | 3506874 | 1/1998 |
| JP | 3654738 | 2/1998 |
| JP | 3795624 | 2/1998 |
| JP | 3304787 | 5/1998 |
| JP | 3344257 | 8/1998 |
| JP | 3223832 | 9/1998 |
| JP | 3374737 | 12/1998 |
| JP | 3314666 | 3/1999 |
| JP | 3748011 B2 | 6/1999 |
| JP | 4118370 | 7/1999 |
| JP | 4118371 | 7/1999 |
| JP | 3548442 | 8/1999 |
| JP | 3622562 | 11/1999 |
| JP | 3424629 | 8/2000 |
| JP | 4860024 | 8/2000 |
| JP | 3063756 | 9/2000 |
| JP | 4629178 | 9/2000 |
| JP | 3063757 | 10/2000 |
| JP | 3511970 | 10/2000 |
| JP | 3551101 | 5/2001 |
| JP | 3427265 | 6/2001 |
| JP | 3646649 | 10/2001 |
| JP | 3780887 | 5/2002 |
| JP | 3890930 | 5/2002 |
| JP | 3786114 | 4/2004 |
| JP | 4904261 | 6/2004 |

OTHER PUBLICATIONS

Dadgar et al., "Epitaxy of GaN on silicon-impact of symmetry and surface reconstruction," New Journal of Physics, vol. 9, No. 389 (2007); IOP Publishing Ltd., http://iopscience.iop.org/1367-2630/9/10/389 (10 pages).

Bae et al., "Surface Investigation of a Cubic AlN Buffer Layer and GaN Grown on Si(111) and Si(100) as Revealed by Atomic Force Microscopy," Journal of the Korean Physical Society, vol. 49, No. 3, Sep. 2006, pp. 1092-1096 (5 pages).

Keyan et al., "Structural analysis of metalorganic chemical vapor deposited AlN nucleation layers on Si(111)," Singapore-MIT Alliance, Jan. 2004, citable URI: http://hdl.handle.net/1721.1/3841 (4 pages).

* cited by examiner

TOP-DOWN VIEW

FIG. 1

CROSS-SECTIONAL SIDE VIEW

FIG. 2

| LAYER | NAME OF LAYER | COMPOSITION AND STRUCTURE | THICKNESS |
|---|---|---|---|
| 1 | SUBSTRATE | SAPPHIRE $AL_2O_3$ (INSULATIVE) | |
| 2 | TEMPLATE | n-GaN<br>DOPANT TYPE = SILICON<br>DOPANT CONCENTRATION = 1E18 ATOMS/CCM | 2000nm |
| 3 | LOW RESISTANCE LAYER (LRL) | $Al_xGa_{1-x}N$/GaN PERIODS<br>5 PERIODS (SUPERLATTICE)<br>$Al_{0.3}Ga_{0.7}N$ 25nm (LOWER SUBLAYER)<br>GaN 100nm (UPPER SUBLAYER)<br>EACH THINNER AlGaN SUBLAYER IS "STRAINED TO" A THICKER LAYER OF GaN<br>SHEET RESISTANCE IS LOWER THAN THE SHEET RESISTANCE OF THE N-TYPE LAYER<br>Si DOPING 1E18 ATOMS/CCM | 625nm |
| 4 | N-TYPE | n-GaN<br>DOPANT TYPE = SILICON<br>DOPANT CONCENTRATION = 5E18 ATOMS/CCM<br>>15 OHMS/SQUARE SHEET RESISTANCE | 2000nm |
| 5 | STRAIN RELEASE | InGaN/GaN PERIODS<br>30 PERIODS<br>$In_{0.05}Ga_{0.95}N$ 2nm<br>GaN 2nm | 120nm |
| 6 | ACTIVE | InGaN/GaN PERIODS<br>10 PERIODS (MQW)<br>InGaN 3nm<br>GaN 10nm<br>In = 15%<br>EMITS NON-MONOCHROMATIC 440nm-490nm WAVELENGTH LIGHT | 130nm |
| 7 | P-TYPE | p-GaN<br>DOPANT TYPE = MAGNESIUN<br>DOPANT CONCENTRATION = 1E20 ATOMS/CCM<br>UPPER SURFACE IS SUBSTANTALLY PLANAR - NO CURRENT FOCUSING RIDGE STRUCTURES | 300nm |
| 8 | TRANSPARENT CONDUCTIVE LAYER (TCL) | INDIUM TIN OXIDE (ITO)<br>OCCUPIES MORE THAN 70 PERCENT OF THE SURFACE OF THE LED | 80nm |
| 9 | P-ELECTRODE METAL | Ni-Au (20/200 nm) | 220nm |
| 10 | N-ELECTRODE METAL | Ti-Al-Ni-Au (20/100/20/200 nm) | 340nm |

LATERALLY CONTACTED BLUE LED WITH SUPERLATTICE CURRENT SPREADING LAYER

TECHNICAL FIELD

The present disclosure relates generally to laterally contacted GaN-based blue LEDs.

BACKGROUND INFORMATION

A Light Emitting Diode (LED) is a solid state device that converts electrical energy to light. Light is emitted from an active layer of semiconductor materials sandwiched between oppositely doped layers when a voltage is applied across the doped layers. There are many different LED device structures that are made of different materials and have different structures and perform in different ways. Some emit laser light, and others generate non-monochromatic light. Some are optimized for performance in particular applications. Some are high power devices and others are not. Some emit light in infrared radiation, whereas others emit visible light of various colors, and still others emit ultraviolet light. Some are expensive to manufacture, whereas others are less expensive. For commercial general lighting applications, a so-called "laterally contacted" blue LED structure is often used at high current densities. Such a blue LED having a Multiple Quantum Well (MQW) active layer involving Indium-gallium-nitride may, for example, emit non-monochromatic light having a wavelength in a range from 440 nanometers to 500 nanometers while having an average current density of 38 amperes per square centimeter or more. A phosphor coating may be provided that absorbs some of the emitted blue light. The phosphor in turn fluoresces to emit light of other wavelengths so that the light the overall LED device emits has a wider range of wavelengths. Improvements in such blue LED devices are sought.

SUMMARY

A laterally contacted blue LED device involves a PAN structure disposed over an insulating substrate. The PAN structure is not a cavity for generating laser light, but rather includes an n-type layer, a light-emitting active layer, and a p-type layer for generating non-monochromatic light. This structure of an active layer sandwiched between two oppositely doped layers is referred to here as a "PAN structure". In one example, the insulating substrate is a sapphire substrate, the n-type layer is an n-doped gallium-nitride layer having a thickness of at least five hundred nanometers, the active layer is a Multiple Quantum Well (MQW) structure that includes an amount of indium, and the p-type layer is a p-doped gallium-nitride layer.

A Low Resistance Layer (LRL) is disposed between the insulating substrate and the overlying PAN structure such that the top boundary portion of the LRL is in contact with the bottom boundary portion of the n-layer of the PAN structure. The LRL in one example is a superlattice structure having a plurality of periods, where at least one of the periods includes an aluminum-gallium-nitride sublayer and a gallium-nitride sublayer. The LRL is relatively more conductive than the n-type layer of the overlying PAN structure. When considered from its upper surface boundary, the LRL has a sheet resistance. When considered from its bottom surface boundary, the n-type layer has a sheet resistance. The sheet resistance of the LRL is smaller than the sheet resistance of the n-type layer.

The blue LED device is a laterally contacted device. A first electrode is disposed on and in electrical contact with a portion of the n-type layer. The n-type layer to which the contact is made is above the LRL superlattice layer. A second electrode is disposed on and in electrical contact with a portion of the p-type layer. Both electrodes are accessible from the top of the blue LED device. A reflective layer is formed to cover the bottom surface of the substrate. When the blue LED device is in operation, current flows from the second electrode, through the P-type layer, through the active layer, down and laterally through the n-type layer, and to the first electrode, without passing through the insulative substrate.

A first function of the LRL layer is to facilitate lateral current flow underneath the n-type layer. During operation, some current flows from a part of the n-type layer, down into the LRL layer, laterally through the LRL layer, and back up into another part of the n-type layer, and to the first electrode. Such current flow through the LRL layer facilitates current spreading and reduces current crowding in the LED device.

A second function of the LRL layer is to reduce the density of lattice dislocation defects in the n-type layer and in other overlying layers in the PAN structure. In one example, the insulative substrate is a sapphire substrate, and a template layer of gallium-nitride is grown on the sapphire substrate. The LRL layer is in turn formed on the template layer. Due to different lattice constants between the sapphire material and gallium-nitride material, the gallium-nitride grows on the sapphire such that the gallium-nitride has lattice dislocation defects. As layer after layer of gallium-nitride forms, these defects are repeated in each subsequent layer, thereby forming what are referred to as "threads" of lattice defects. These threads extend upward from the sapphire to gallium-nitride interface. Some of these threads may extend all the way through the gallium-nitride template layer. The LRL layer disposed on the gallium-nitride template layer interrupts these dislocation threads such that the threads do not extend beyond the LRL layer and into the overlying n-type gallium-nitride layer. The n-type gallium-nitride layer of the PAN structure therefore does not exhibit the higher dislocation defect density of the underlying gallium-nitride template layer. The reduced dislocation defect density in the n-type gallium-nitride layer improves LED device performance.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings. In the description and claims below, when a first layer is referred to as being disposed "over" a second layer, it is to be understood that the first layer can be directly on the second layer, or an intervening layer or layers may be present between the first and second layers. The terms such as "over", "under", "upper", "lower", "top", "bottom", "upward", "downward", "vertically", and "laterally" are used herein to describe relative orientations between different parts of the blue LED being described, and it is to be understood that the overall blue LED structure being described can actually be oriented in any way in three-dimensional space.

Figure 1:
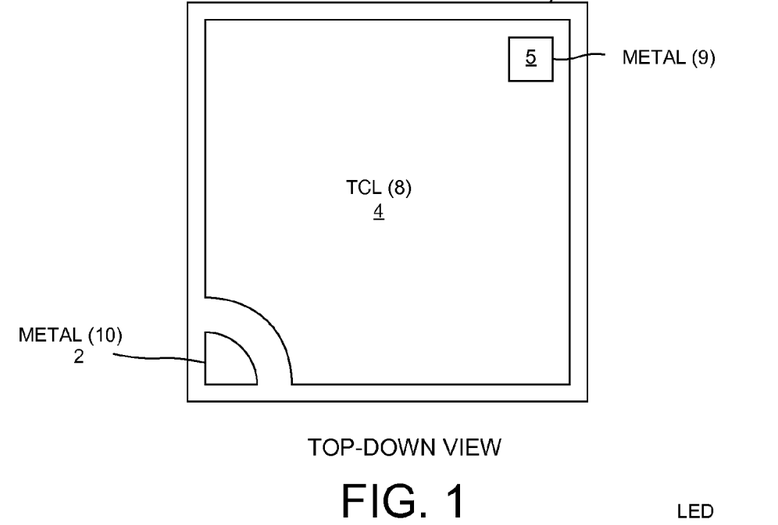
FIG. 1 is a top-down diagram of a blue LED device.

FIG. 1 is a top-down diagram of a blue Light Emitting Diode (LED) device 1 in accordance with one novel aspect. Blue LED device 1 includes a first electrode 2 and a second electrode 3. The first electrode 2 is a bonding pad of metal. The second electrode 3 includes a Transparent Conductive Layer (TCL) 4 and a bonding pad of metal 5. The second electrode covers more than seventy percent of the surface of the LED device 1. LED device 1 is said to be a "laterally contacted" LED device because the bonding pads of both electrodes are disposed on the same side of the LED structure such that they appear laterally oriented with respect to one another in the view of FIG. 1. Both bonding pads of metal 2 and 5 are accessible from the top of the LED device.

Figure 2:
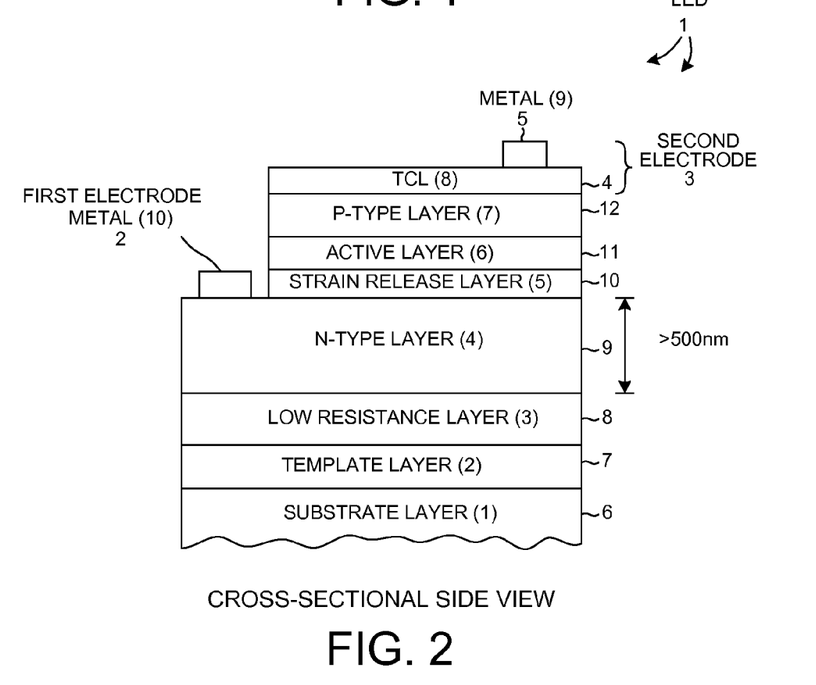
FIG. 2 is a simplified cross-sectional diagram of the blue LED device of FIG. 1.

FIG. 2 is a cross-sectional diagram of the LED device 1 of FIG. 1. The bottom layer of LED device 1 is a substrate that is substantially transparent to blue light, such as a sapphire substrate 6 ($Al_2O_3$). This substrate is electrically insulative. A template layer 7 of n-doped gallium-nitride (n-GaN) is disposed on the sapphire substrate 6. In the present example, template layer 7 has a thickness of 2000 nm. The gallium-nitride is doped with the n-type dopant silicon to a concentration of $1 \times 10^{18}$ atoms per cubic centimeter. In other embodiments, the template layer 7 is undoped gallium-nitride (u-GaN).

A Low Resistance Layer (LRL) 8 is disposed on template layer 7. LRL 8 is called "low resistance" because it has a lower sheet resistance than does an overlying n-type contact layer. LRL 8 in the present example is a superlattice structure having five periods. Each of the five periods includes a relatively thinner sublayer of aluminum-gallium-nitride (AlGaN) and a relatively thicker sublayer of gallium-nitride (GaN). In one example, the aluminum-gallium-nitride sublayer is less than one half the thickness of the gallium-nitride sublayer. The relative concentrations of aluminum and gallium in the aluminum-gallium-nitride sublayers is given by $Al_{0.3}Ga_{0.7}N$. Each thinner aluminum-gallium-nitride sublayer of LRL 8 is strained to an adjacent thicker layer of gallium-nitride and/or to an adjacent thicker sublayer of gallium-nitride. In this way, the aluminum-gallium-nitride sublayer is strained to the lattice constant of gallium-nitride. In the present example, the bottom sublayer of the first period that is disposed on and in contact with the underlying gallium-nitride template layer 7 is a sublayer of aluminum-gallium-nitride. The material of LRL 8 is doped with silicon at a concentration of $1 \times 10^{18}$ atoms per cubic centimeter. The superlattice is structured such that regions of so-called electron gas are formed in the gallium-nitride sublayers. As is understood in the art, these electrons have a high mobility. This results in the desired low resistivity of the overall LRL 8. Considered from its upper surface boundary, LRL 8 in the present example has a sheet resistance that is less than the sheet resistance of an overlying n-type layer.

An n-type layer 9 is disposed on LRL 8. This n-type layer 9 is an n-doped gallium-nitride layer having a thickness of 2000 nm. The gallium-nitride is doped with the n-type dopant silicon to a concentration of $5 \times 10^{18}$ atoms per cubic centimeter. In the present example, if considered from its bottom surface boundary, n-type layer 9 has a sheet resistance that is about eighteen ohms per square at room temperature (more than fifteen ohms per square). The n-type layer 9 cannot be too thin or the ability of the underlying LRL superlattice to reduce current crowding will substantially degraded, consequently the n-type layer 9 should be more than 500 nm thick.

A strain release layer 10 is disposed on n-type layer 9. In the present example, strain release layer 10 includes thirty periods, where each period includes an indium-gallium-nitride sublayer and a gallium-nitride sublayer. The indium-gallium-nitride sublayer has a thickness of 2 nm and has an indium concentration given by $In_{0.05}Ga_{0.95}N$. The gallium-nitride sublayer has a thickness of 2 nm. The entire strain release layer 10 has a thickness of 120 nm.

An active layer 11 is disposed on strain release layer 10. Active layer 11 includes ten periods, where each period includes an indium-gallium-nitride sublayer and a gallium-nitride sublayer. The indium-gallium-nitride sublayer has a thickness of 3 nm. The gallium-nitride sublayer has a thickness of 10 nm. Active layer 11 has a total thickness of 130 nm.

Disposed on active layer 11 is a p-type layer 12. P-type layer 12 is a single layer of uniformly doped p-type gallium-nitride. In the present example, the upper surface of P-type layer 12 has no current focusing ridge structures such as are commonly provided in laser diodes to focus current. P-type layer 12 has a thickness of 300 nm. The gallium-nitride is uniformly doped throughout with the p-type dopant magnesium to a concentration of $1 \times 10^{20}$ atoms per cubic centimeter. N-type layer 9, strain release layer 10, active layer 11, and p-type layer 12 are referred to together as a PAN structure.

Disposed on p-type layer 12 is the Transparent Conductive Layer (TCL) 4 of the second electrode 3 as shown in FIG. 2. In the present example, TCL is a 80 nm thick layer of indium-tin-oxide (ITO). The metal bonding pad of first electrode 2 is a multi-layer metal structure (Ti—Al—Ni—Au) having a thickness of 340 nm. Metal bonding pad 5 of the second electrode 3 is a multi-layer metal structure (Ni—Au) having a thickness of 220 nm.

Figure 3:
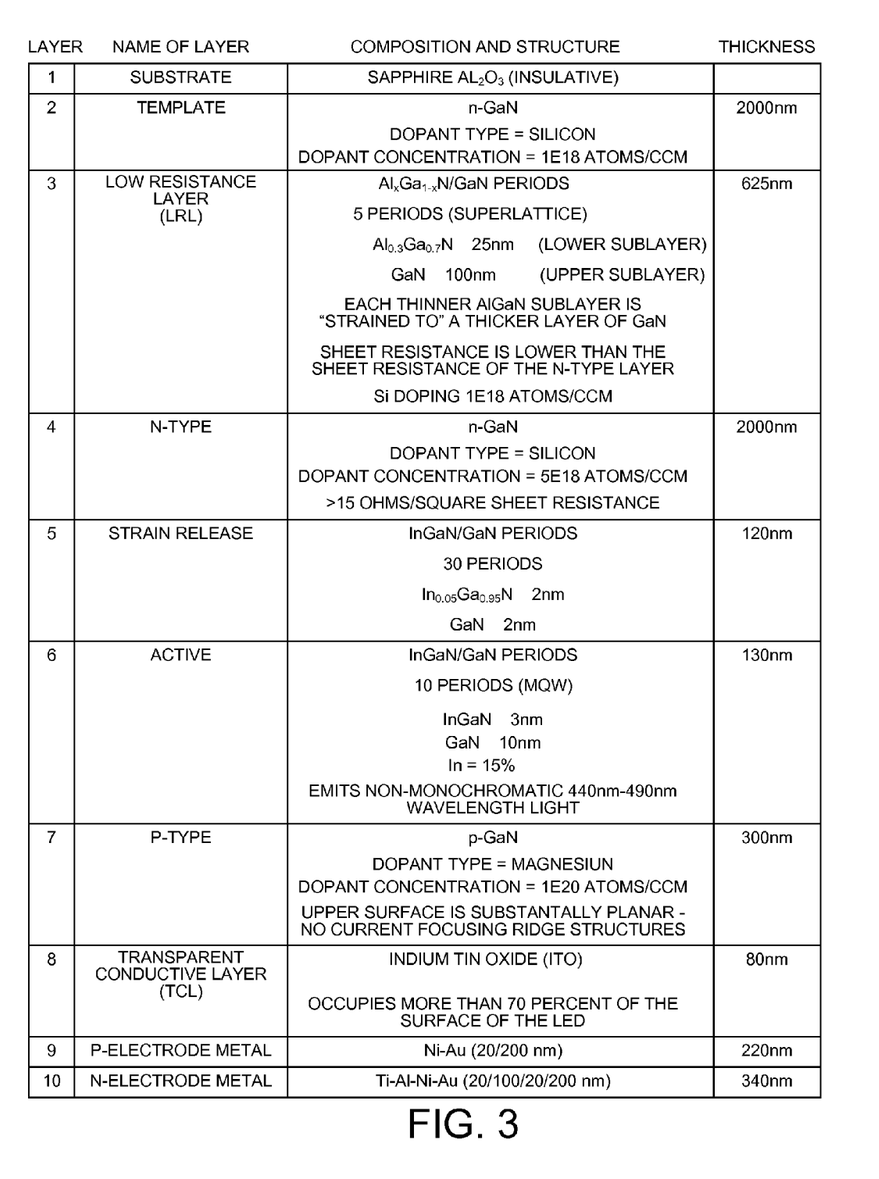
FIG. 3 is a table that sets forth the composition, structure, and thickness of each layer of the blue LED device of FIG. 1 and FIG. 2.

FIG. 3 is a table that sets forth the composition, structure and thickness of the constituent layers of the blue LED device 1 of FIG. 1 and FIG. 2.

Figure 4:
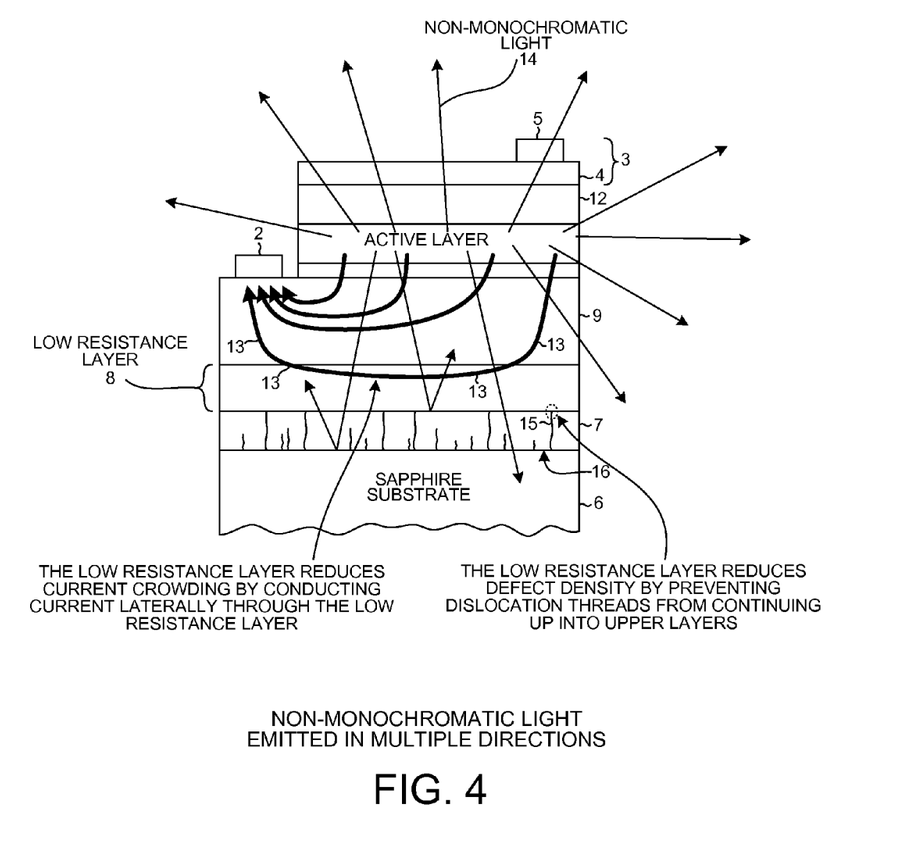
FIG. 4 is a diagram that illustrates an operation of the blue LED device of FIG. 1 and FIG. 2.

FIG. 4 is a cross-sectional diagram that illustrates an operation of blue LED device 1 of FIG. 1 and FIG. 2. When current flows from second electrode 3 to first electrode 2, electrons and holes combine in active layer 11 thereby emitting non-monochromatic light 14. LED device 1 is said to be a "blue" LED device in that the light 14 emitted has a wavelength in a range of from approximately 440 nm to approximately 500 nm. Light 14 is emitted in many directions, and some of the light passes through the p-layer 12 on its way out of the LED device.

In a "laterally contacted" blue LED structure, current flow should pass downward through the light generating active layer with a current density that is uniform across the area of the upper surface boundary of the active layer. Once current has passed vertically downward through the active layer, the current is generally concentrated to higher current densities as it turns and flows laterally through the n-type layer to the laterally displaced first electrode. Nevertheless, localized peaks in current density in the n-layer should be minimized. In a real world LED device, however, current crowding may occur such that there is a significantly higher current density in some portions of the active layer than there is in other portions. In a blue LED used in a commercial lighting application where a large current is forced through a small LED structure, current flow through these areas where there is localized current crowding can be so great that the LED device may fail. If a failure does not result, the undesirable localized current crowding may nevertheless reduce the maximum current that can be conducted through the LED structure without causing failures.

In accordance with one novel aspect, LRL 8 serves a first function in reducing current crowding in the overlaying layers and/or in reducing maximum current densities in the overlying layers. LRL 8 is relatively conductive as compared to overlying n-type layer 9. LRL 8 is disposed directly beneath and in contact with n-type layer 9. Consequently, some current is conducted laterally through LRL 8 as conceptually depicted by arrow 13 in FIG. 4.

In one example, the sheet resistance of n-type gallium-nitride layer 9 is higher than the sheet resistance of LRL 8, when these sheet resistances are considered at the layer 9/layer 8 interface. The sheet resistance of a layer for this purpose can be measured in various known destructive, non-destructive, direct and indirect ways. In one direct and destructive way, all the LED device layers above the layer of interest are ground away or are otherwise removed. Known chemical mechanical polishing and etching techniques can be employed. The exposed upper surface of the layer of interest is then attached to an insulative substrate, and all the layers below the layer of interest are ground away or otherwise removed. What is left is the layer of interest, isolated from all other layers of the LED device, and mounted to the insulative substrate. The sheet resistance of the isolated layer is then measured by probing the exposed upper surface of the layer. In the present example, when this procedure is used, the sheet resistance of n-type gallium-nitride layer 9 of a thickness of approximately 2000 nm is measured to be more than fifteen ohms per square, whereas the sheet resistance of the underlying LRL 8 is lower than the sheet resistance of layer 9.

LRL 8 also serves a second function in facilitating the growth of low defect films over a gallium-nitride template grown on a sapphire substrate. A gallium-nitride epitaxial layer grown on a sapphire substrate has proven to be a good foundation upon which to fabricate PAN structures of GaN-based LEDs. Lattice dislocation densities in gallium-nitride grown on sapphire are typically less than $5 \times 10^8$ dislocations per square centimeter. Accordingly, sapphire is commonly considered to be a preferred substrate for blue GaN-based LEDs. Nonetheless, there is still a difference in lattice constants between sapphire and gallium-nitride. Consequently when a gallium-nitride template layer is grown on a sapphire substrate, some lattice dislocations do occur in the growing gallium-nitride. In accordance with one novel aspect, providing LRL 8 in LED device 1 results in a lower lattice defect density in the overlying epitaxial layers of the blue LED than would otherwise occur. The superlattice of LRL 8 is not the $Al_xGa_{1-x}N/Al_yGa_{1-y}N$ superlattice used in deep UV LEDs where the n-layer of the PAN structure is n-doped AlGaN. Such an $Al_xGa_{1-x}N/Al_yGa_{1-y}N$ superlattice if used in a blue LED may actually increase dislocation density. In the blue LED device of FIG. 1 and FIG. 2, n-layer 9 is n-doped gallium-nitride that contains substantially no aluminum. LRL 8 is therefore an AlGaN/GaN superlattice. The AlGaN sublayers of the superlattice are strained to the lattice of thicker layers of gallium-nitride and/or to the lattice of thicker sublayers of gallium-nitride. The lattice constant of LRL 8 therefore closely matches the lattice constant of underlying gallium-nitride template layer 7, thereby reducing stress at the interface, and thereby preventing the continued formation of defect threads upward from the template layer 7. The superlattice of LRL 8 blocks the threads of dislocations in the template layer 7 from extending upward into the n-type layer 9. Reference numeral 15 in FIG. 4 identifies one such dislocation thread. This dislocation thread 15 extends upward from the substrate-to-template interface 16 but it is terminated by LRL 8. When epitaxial layers of the LED are later grown over LRL 8, such as n-type layer 9, the epitaxial layers do not contain a continuation of the same thread 15.

Figure 5:
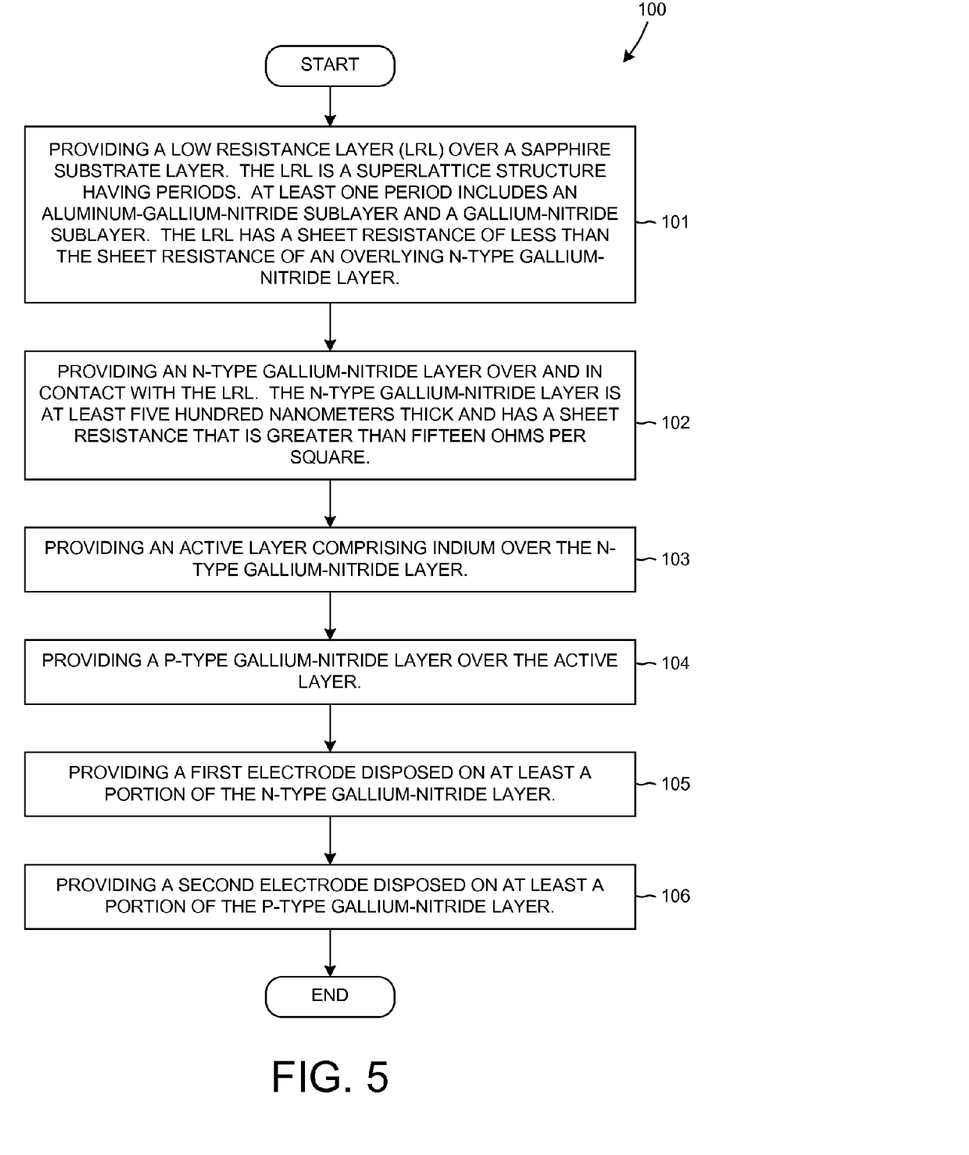
FIG. 5 is a flowchart of a method in accordance with one novel aspect.

FIG. 5 is a flowchart of a method 100. A Low Resistance Layer (LRL) is provided (step 101) over a sapphire substrate layer. In one example, the LRL is a superlattice structure having periods. At least one period includes an aluminum-gallium-nitride sublayer and a gallium-nitride sublayer. The aluminum-gallium-nitride sublayers are strained to a gallium-nitride lattice. When considered from its upper surface boundary, the LRL has a sheet resistance that is less than the sheet resistance of an overlying n-type layer. In one example, this LRL is LRL 8 of FIG. 2 and the overlying n-type layer is layer 9 of FIG. 2.

An n-type gallium-nitride layer is provided (step 102) over and in contact with the LRL. This n-type gallium-nitride layer is at least five hundred nanometers thick. When considered from its lower surface boundary, the n-type gallium-nitride layer has a sheet resistance that is greater than fifteen ohms per square. In one example, this n-type gallium-nitride layer is layer 9 of FIG. 2.

An active layer is provided (step 103) over the n-type gallium-nitride layer. In one example, the active layer is layer 11 of FIG. 2 that is a multiple quantum well structure involving indium-gallium-nitride sublayers and gallium-nitride sublayers. In one example, a strain release layer is disposed between the active layer and the underlying n-type gallium-nitride layer. In another example, no intervening strain release layer is present.

A p-type gallium-nitride layer is provided (step 104) over the active layer. In one example, the p-type gallium-nitride layer is layer 12 of FIG. 2.

A first electrode is provided (step 105). The first electrode is disposed on and in electrical contact with at least a portion of the n-type gallium-nitride layer. In one example, the first electrode is electrode 2 of FIG. 2.

A second electrode is provided (step 106). The second electrode is disposed on and in electrical contact with at least a portion of the p-type gallium-nitride layer. In one example, the second electrode is electrode 3 in FIG. 2. A reflective layer is formed to cover the bottom surface of the substrate. In operation, current flows from the second electrode, through the p-type gallium-nitride layer, through the active layer, through the n-type gallium-nitride layer, and to the first electrode such that the LED device emits non-monochromatic blue light. Some current flows down from the n-type gallium-nitride layer, laterally through the LRL, and flows up into the n-type gallium-nitride layer, and to the first electrode.

The steps 101-106 of method 100 can carried out simultaneously by selling an LED device to another entity, or by otherwise supplying or delivering an LED device to another entity. Method 100 can also be carried out by performing the steps 101-106 sequentially in the manufacture of an LED device. An example of the LED device is LED device 1 of FIG. 1 and FIG. 2.

Although certain specific embodiments are described above for instructional purposes, the teachings of this patent document have general applicability and are not limited to the specific embodiments described above. The LRL can be fabricated in numerous different suitable ways. In one example, the LRL involves periods, where each period includes a first aluminum-gallium-nitride layer and a second aluminum-gallium-nitride layer, where the aluminum concentrations in the two sublayers differ from one another. The composition of the two sublayers is given by $Al_xGa_{1-x}N/Al_yGa_{1-y}N$, where x and y are different nonzero numbers. Although a specific example is described above in which the aluminum-gallium-nitride and gallium-nitride sublayers of the LRL are of different thicknesses, in other examples the sublayers are of substantially the same thickness. In an AlGaN/GaN or AlGaN/AlGaN superlattice the aluminum concentration in one of a sublayer containing aluminum can be graded. The LRL can be an AlInN/GaN superlattice. The LRL can be an AlGaN/AlGaN/GaN superlattice where each period involves three sublayers.

Although a blue LED is described above in connection with the LRL being disposed between a sapphire substrate and an overlying n-type gallium-nitride layer, the substrate need not be sapphire but rather can be another suitable insulative substrate or another suitable conductive substrate. The template layer need not be n-type gallium-nitride in all examples, but rather can be another suitable template material. For example, a template layer of aluminum-nitride may be used over and in contact with a substrate of silicon. Accordingly, various modifications, adaptations, and combinations of various features of the described embodiments can be practiced without departing from the scope of the invention as set forth in the claims.

What is claimed is:

1. A Light Emitting Diode (LED) device for emitting non-monochromatic light, the LED device comprising:
   a substrate layer;
   a low resistance layer disposed over the substrate layer, wherein the low resistance layer includes a plurality of periods, and wherein at least one of the periods of the low resistance layer includes an aluminum-gallium-nitride sublayer and a gallium-nitride sublayer;
   an n-type layer disposed over and in contact with the low resistance layer, and wherein the n-type layer has a thickness of more than at least five hundred nanometers;
   an active layer disposed over the n-type layer, wherein the active layer includes a plurality of periods, and wherein at least one of the periods of the active layer includes an indium-gallium-nitride sublayer and a gallium-nitride sublayer;
   a p-type layer disposed over the active layer;
   a first electrode disposed on and in electrical contact with at least a portion of the n-type layer; and
   a second electrode disposed on and in electrical contact with at least a portion of the p-type layer, and wherein current flow between the first and second electrodes causes the non-monochromatic light to be emitted and to pass through the p-layer.

2. The LED device of claim 1, wherein the low resistance layer has a sheet resistance, wherein the n-type layer has a sheet resistance, and wherein the sheet resistance of the low resistance layer is smaller than the sheet resistance of the n-type layer.

3. The LED device of claim 1, wherein said aluminum-gallium-nitride sublayer of said at least one period of the low resistance layer is strained to a gallium-nitride sublayer of the low resistance layer.

4. The LED device of claim 3, wherein said aluminum-gallium-nitride sublayer of said at least one period of the low resistance layer is less than half as thick as said gallium-nitride sublayer of said at least one period of the low resistance layer.

5. The LED device of claim 3, wherein the aluminum-gallium-nitride sublayer of said at least one period has a thickness, wherein the gallium-nitride sublayer of said least one period of the low resistance layer has a thickness, and wherein the thickness of the gallium-nitride sublayer of said at least one period is substantially the same as the thickness of the gallium-nitride sublayer of said least at least one period.

6. The LED device of claim 1, further comprising:
   a superlattice layer disposed between the n-type layer and the active layer, wherein the superlattice layer includes a plurality of periods, wherein at least one of the periods of the superlattice layer includes a first indium-gallium-nitride sublayer having a first indium concentration and includes a second indium-gallium-nitride sublayer having a second indium concentration, and wherein the first indium concentration is different from the second indium concentration.

7. The LED device of claim 1, further comprising:
   a superlattice layer disposed between the n-type layer and the active layer, wherein the superlattice layer includes a plurality of periods, wherein at least one of the periods of the superlattice layer includes an indium-gallium-nitride sublayer and a gallium-nitride sublayer.

8. The LED device of claim 1, wherein the substrate layer is an insulative substrate layer that is substantially transparent to blue light.

9. The LED device of claim 1, wherein the substrate layer is a sapphire layer, and wherein the LED device further comprises:
   a template layer disposed between the substrate layer and the low resistance layer, wherein the template layer is a layer of a material taken from the group consisting of: undoped gallium-nitride and n-type gallium-nitride.

10. The LED device of claim 1, wherein the second electrode includes a transparent conductive layer and a bonding pad of metal.

11. A Light Emitting Diode (LED) device for emitting non-monochromatic light, the LED device comprising:
    a sapphire substrate layer;
    a low resistance layer disposed over the substrate layer, wherein the low resistance layer has a sheet resistance, wherein the low resistance layer includes a plurality of periods, and wherein at least one of the periods includes a gallium-nitride sublayer;
    an n-type layer disposed over and in contact with the low resistance layer, wherein the n-type layer has a thickness of at least five hundred nanometers, wherein the n-type layer has a sheet resistance that is higher than the sheet resistance of the low resistance layer;
    an active layer disposed over the n-type layer, wherein the active layer includes a plurality of periods, and wherein at least one of the periods of the active layer includes an indium-gallium-nitride sublayer and a gallium-nitride sublayer;
    a p-type layer disposed over the active layer;
    a first electrode disposed on and in electrical contact with at least a portion of the n-type layer; and
    a second electrode in electrical disposed on and in electrical contact with at least a portion of the p-type layer, and wherein current flow between the first and second electrodes causes the non-monochromatic light to be emitted such that at least some of the light passes through the p-layer.

12. The LED device of claim 11, further comprising:
    a strain release layer disposed between the n-type layer and the active layer.

13. A method comprising:
    providing a low resistance layer over a sapphire substrate layer, wherein the low resistance layer comprises a plurality of periods, wherein at least one of the periods includes a gallium-nitride sublayer and an aluminum-gallium-nitride sublayer;

providing an n-type gallium-nitride layer on and in contact with the low resistance layer, wherein the n-type gallium-nitride layer has a thickness of at least five hundred nanometers, and wherein the n-type gallium-nitride layer has a sheet resistance that is larger than a sheet resistance of the low resistance layer;

providing an active layer comprising indium over the n-type gallium-nitride layer;

providing a p-type gallium-nitride layer over the active layer;

providing a first electrode that is disposed on and in electrical contact with at least a portion of the n-type gallium-nitride layer; and providing a second electrode that is disposed on and in electrical contact with at least a portion of the p-type gallium-nitride layer such that conducting a current between the first and second electrodes will cause non-monochromatic light to be emitted from the active layer such that at least some of the light will pass through the p-type gallium-nitride layer.

14. The method of claim 13, wherein the sheet resistance of the low resistance layer is less than fifteen ohms per square at room temperature, and wherein the sheet resistance of the n-type gallium-nitride layer is more than fifteen ohms per square at room temperature.

15. A Light Emitting Diode (LED) device for emitting non-monochromatic light, the LED device comprising:
   a substrate layer;
   an n-type gallium-nitride layer having a thickness of at least five hundred nanometers;
   an active layer disposed over the n-type gallium-nitride layer, wherein the active layer includes a plurality of periods, and wherein at least one of the periods of the active layer includes an amount of indium;
   a p-type gallium-nitride layer disposed over the active layer;
   a first electrode disposed on at least a portion of the n-type gallium-nitride layer;
   a second electrode disposed on at least a portion of the p-type gallium-nitride layer such that a current flow between the first and second electrodes will cause the non-monochromatic light to be emitted and to pass through the p-type gallium-nitride layer; and
   means for spreading current, wherein the means has a sheet resistance that is lower than a sheet resistance of the n-type gallium-nitride layer, and wherein the means is in contact with the n-type gallium-nitride layer and is disposed between the substrate layer and the n-type gallium-nitride layer.

16. The LED device of claim 15, wherein the substrate layer is a sapphire substrate layer, wherein the means for spreading current is disposed on and is in contact with a template layer of gallium-nitride, and wherein the template layer of gallium-nitride is disposed on and is in contact with the substrate layer.

17. The LED device of claim 16, wherein the means for spreading current comprises:
   a sublayer of gallium-nitride; and
   a sublayer of aluminum-gallium-nitride that is in contact with and is strained to the sublayer of gallium-nitride, wherein the sublayer of aluminum-gallium-nitride is less than half as thick as the sublayer of gallium-nitride.

18. A Light Emitting Diode (LED) device for emitting non-monochromatic light, the LED device comprising:
   a sapphire substrate layer;
   a superlattice layer disposed over the sapphire substrate layer, wherein the superlattice layer includes a plurality of periods, and wherein at least one of the periods of the low resistance layer includes an aluminum-gallium-nitride sublayer and a gallium-nitride sublayer;
   an n-type gallium-nitride layer disposed over and in contact with the superlattice layer, and wherein the n-type gallium-nitride layer has a thickness of more than at least five hundred nanometers;
   an active layer disposed over the n-type gallium-nitride layer, wherein the active layer includes a plurality of periods, and wherein at least one of the periods of the active layer includes an indium-gallium-nitride sublayer and a gallium-nitride sublayer;
   a p-type gallium-nitride layer disposed over the active layer;
   a first electrode disposed on and in electrical contact with at least a portion of the n-type gallium-nitride layer; and
   a second electrode disposed on and in electrical contact with at least a portion of the p-type gallium-nitride layer, and wherein current flow between the first and second electrodes causes the non-monochromatic light to be emitted from the LED device.

19. The LED device of claim 18, wherein the superlattice layer is disposed on and is in contact with a template layer of gallium-nitride, and wherein the template layer of gallium-nitride is disposed on and is in contact with the sapphire substrate layer.

* * * * *

UNITED STATES PATENT AND TRADEMARK OFFICE
CERTIFICATE OF CORRECTION

| | | |
|---|---|---|
| PATENT NO. | : 8,395,165 B2 | Page 1 of 1 |
| APPLICATION NO. | : 13/178497 | |
| DATED | : March 12, 2013 | |
| INVENTOR(S) | : Chen et al. | |

It is certified that error appears in the above-identified patent and that said Letters Patent is hereby corrected as shown below:

Title Page, Item (73)
The name of the assignee "Bridelux, Inc." should be changed to --Bridgelux, Inc.--

Signed and Sealed this
Thirtieth Day of April, 2013

Teresa Stanek Rea
*Acting Director of the United States Patent and Trademark Office*